(12) United States Patent
Kataoka et al.

(10) Patent No.: US 6,643,564 B2
(45) Date of Patent: Nov. 4, 2003

(54) METHOD OF DETERMINING RETREAT PERMISSION POSITION OF CARRIER ARM AND TEACHING DEVICE THEREOF

(75) Inventors: Yukinori Kataoka, Kumamoto (JP); Naruaki Iida, Kumamoto (JP); Seiji Kozawa, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/346,111

(22) Filed: Jan. 17, 2003

(65) Prior Publication Data

US 2003/0139852 A1 Jul. 24, 2003

(30) Foreign Application Priority Data

Jan. 22, 2002 (JP) ........................................ 2002-012900

(51) Int. Cl.$^7$ ........................... G05B 15/00; G05B 19/00
(52) U.S. Cl. ...................... 700/258; 700/265; 700/248; 700/249; 700/259; 700/260; 700/261; 700/262; 700/263; 700/264; 701/23; 369/53.19; 414/730; 414/217; 414/777; 414/757; 414/941; 250/206.1
(58) Field of Search ................................ 700/275, 245, 700/248, 249, 250, 258, 259, 260, 261, 262, 263, 264; 414/730, 805, 757, 217, 777, 816, 941, 937, 222.02, 222.06; 250/206.1; 701/23; 29/740, 854, 857, 860; 228/3.1; 204/199, 222, 187; 369/53.19, 44.32

(56) References Cited

U.S. PATENT DOCUMENTS

| 5,339,128 | A | * | 8/1994 | Tateyama et al. ............ 396/604 |
| 5,442,416 | A | * | 8/1995 | Tateyama et al. ............ 396/612 |
| 5,445,491 | A | * | 8/1995 | Nakagawa et al. ........... 414/805 |
| 6,054,181 | A | * | 4/2000 | Nanbu et al. ................. 427/240 |
| 6,312,174 | B1 | * | 11/2001 | Drynkin et al. ........... 400/120.16 |
| 6,332,751 | B1 | | 12/2001 | Kozawa et al. .............. 414/816 |
| 6,354,922 | B1 | * | 3/2002 | Sakurai et al. ................. 451/67 |
| 6,358,126 | B1 | * | 3/2002 | Jackson et al. ................. 451/65 |
| 6,358,128 | B1 | * | 3/2002 | Sakurai et al. ................. 451/67 |
| 6,438,460 | B1 | * | 8/2002 | Bacchi et al. ................. 700/275 |
| 6,453,214 | B1 | * | 9/2002 | Bacchi et al. ................. 700/245 |
| 2001/0044266 | A1 | * | 11/2001 | Katsuoka et al. ............... 451/66 |
| 2002/0000371 | A1 | * | 1/2002 | Mishima et al. ............. 204/199 |
| 2002/0042666 | A1 | * | 4/2002 | Bacchi et al. ................. 700/275 |

* cited by examiner

Primary Examiner—William A Cuchlinski, Jr.
Assistant Examiner—McDieunel Marc
(74) Attorney, Agent, or Firm—Oblon, Spivak, McClelland, Maier & Neustadt, P.C.

(57) ABSTRACT

A retreat permission position of a carrier arm when the carrier arm is moved back to retreat outside a mounting table after the carrier arm carries a substrate to a position above the mounting table while holding a peripheral portion of the substrate, to thereby place the substrate on a plurality of supporting pins vertically movable through the mounting table. A disk substantially equal in size to the substrate, having insertion holes formed to allow the supporting pins to be inserted therethrough and being supportable by the carrier arm, and a sensor to detect whether or not the supporting pin inserted through the insertion hole of this disk exists. After an output signal is received from the sensor, a position to which the carrier arm is to be moved in a vertical direction relatively to the disk from a detection position of a tip of the supporting pin is calculated by an operation, an amount of this movement exceeding at least a thickness of the carrier arm, and this position is taught as the retreat permission position of the carrier arm.

8 Claims, 9 Drawing Sheets

METHOD OF DETERMINING RETREAT PERMISSION POSITION OF CARRIER ARM AND TEACHING DEVICE THEREOF

BACKGROUND OF THE INVENTION

1. Field of the Invention

The present invention relates to a method of determining a retreat permission position of a carrier arm after the delivery of a thin plate substrate (hereinafter, simply referred to as a substrate) such as, for example, a semiconductor wafer and a glass substrate for liquid crystal to a plurality of supporting pins when the substrate is to be delivered to a mounting table in a processing unit or the like via the supporting pins from the carrier arm and to a device for teaching the retreat permission position.

2. Description of the Related Art

In semiconductor wafer fabricating steps, a photolithography technique is generally used for forming a resist pattern over a surface of a substrate such as a semiconductor wafer and an LCD substrate. This photolithography technique includes a resist coating step of coating the surface of the substrate with a resist solution, an exposure processing step of exposing a circuit pattern on the formed resist film, and a developing treatment step of supplying a developing solution to the substrate after the exposure processing.

Between the above steps, various kinds of heat processing are carried out, such as, heat processing (prebake), which is carried out, for example, between the resist coating step and the exposure processing step, for improving adhesiveness between the substrate and the resist film by evaporating a residual solvent in the resist film, heat processing (post-exposure bake (PEB)), which is carried out between the exposure processing step and the developing treatment step, for preventing the occurrence of fringe or inducing an acid catalyst reaction in a chemically amplified resist (CAR), and, heat processing (post-bake), which is carried out after the developing treatment step, for removing a residual solvent in the resist and a rinse agent taken into the resist during the developing to remedy infiltration at the time of wet etching.

As a heat processing unit for use in the heat processing, a unit as shown in FIG. 8 and FIG. 9 has been conventionally used. This unit has a mounting table 25 provided with a heater 26 and capable of heating a semiconductor wafer W (hereinafter, referred to as a wafer W) as a substrate to be processed up to a predetermined temperature, proximity pins 70 for supporting the wafer W with a slight spaced interval being kept from the mounting table 25 at the time of the heat processing, and a plurality of, for example, three ascendable/descendible supporting pins 80 passing through supporting pin guiding through holes arranged in and concentrically with the mounting table 25 at a plurality of, for example, three positions at equal spaced intervals. The wafer W is supported by tips of the supporting pins 80, and the descent of the supporting pins 80 causes the wafer W to be placed on the mounting table 25, more precisely, on the proximity pins 70.

The wafer W is delivered to this heat processing unit in such a manner that a carrier arm 28 of a substrate transfer mechanism 21 holds a peripheral portion of the substrate to be processed (wafer W) to carry this wafer W to a position above the mounting table 25, and then either the carrier arm 28 is descended or the supporting pins 80 are ascended to place the wafer W on the supporting pins 80, and thereafter, the supporting pins 80 descend to place the wafer W on the mounting table 25 after the carrier arm 28 moves back to retreat outside the mounting table 25.

In such delivery, it is necessary to prevent the carrier arm 28 from obstructing the delivery step of the wafer W based on a height position at the time when the tips of, for example, three supporting pins 80 abut against a lower surface of the wafer W, namely, a position at which the supporting pins 80 support the wafer W. This means that it is necessary that appropriate determination has been made in advance on a retreat permission position from which the carrier arm 28 is to start retreating outside the mounting table 25 after delivering the wafer W to the supporting pins 80. When this position is not appropriate, the following problem occurs. For example, in the case when the carrier arm 28 is lowered to deliver the wafer W to the supporting pins 80, a lower limit position of the descent of the carrier arm 28, in other words, the timing of returning the carrier arm 28 becomes inappropriate so that the carrier arm 28 is returned with the wafer W being left placed thereon. In the case when the supporting pins 80 is hoisted to deliver the wafer W onto the supporting pins 80, an upper limit position of the ascent of the supporting pins 80, in other words, the timing of returning the carrier arm 28 becomes inappropriate so that the carrier arm 28 is returned with the wafer W being left placed thereon.

Further, in such delivery of the substrate, position adjustment of the carrier arm 28 in a horizontal plane is also important in order to prevent position deviation of the wafer W when the wafer W is delivered to the supporting pins 80.

For this purpose, an operation of teaching the carrier arm of a substrate carrier the retreat permission position of the carrier arm and a substrate delivery position (transfer teaching) has been conventionally performed by an operator prior to the actual transfer of the wafer W. Specifically, a position apart from a height position at which the tips of the aforesaid three supporting pins 80 abut against the lower surface of the wafer W, by a predetermined amount in a height direction (namely, the retreat permission position of the carrier arm) has been conventionally calculated based on operator's gauge measurement, an operation amount of a robot arm of the substrate carrier is determined based on the retreat permission position of the carrier arm, and an arm operation is taught through manual input.

However, the operation of determining the retreat permission position of the carrier arm by the gauge measurement is difficult for the operator and also involves a safety problem. Therefore, the provision of a means for automatically determining and teaching the carrier arm the retreat permission position and so on of the carrier arm is expected.

Further, for this kind of substrate carrier provided with the aforesaid carrier arm, also expected is the provision of a method capable of teaching the carrier arm the adjustment of the extent of carrier arm forward movement in a depth direction in the horizontal plane and the fine adjustment in a right-left direction for the purpose of determining the position of the substrate, which is to be delivered to the supporting pins, in the horizontal plane.

It is an object of this invention to provide a technique of automatically determining and teaching the carrier arm the retreat permission position of the carrier arm after delivering the substrate to the supporting pins and further to provide a technique of facilitating the judgment of the substrate delivery position of the carrier arm.

SUMMARY OF THE INVENTION

A method of the present invention is a method of determining a retreat permission position of a carrier arm when the carrier arm is moved back to retreat outside a mounting table after the carrier arm carries a substrate to a position above the mounting table while holding a peripheral portion of the substrate, to thereby place the substrate on a plurality of ascendable/descendible supporting pins passing through the mounting table, the method comprising the following. Namely, preparing a disk substantially equal in size to the substrate; and providing the disk with a sensor capable of detecting whether the supporting pin exists or not, for at least one insertion hole among a plurality of insertion holes formed to allow the plural supporting pins to be inserted therethrough. Further, carrying the disk to the position above the mounting table while holding the peripheral portion of the disk by the carrier arm, and relatively moving the carrier arm and the supporting pins in a vertical direction to detect a tip of the supporting pin by the sensor; and calculating a position to which the carrier arm is to be moved in a height direction relatively to the disk from a detection position of the tip of the supporting pin, an amount of this movement exceeding at least a thickness of the carrier arm, thereby determining this position as the retreat permission position of the carrier arm.

A device of the present invention is a device for teaching a retreat permission position of a carrier arm when the carrier arm is moved back to retreat outside a mounting table after the carrier arm carries a substrate to a position above the mounting table while holding a peripheral portion of the substrate, to thereby place the substrate on a plurality of ascendable/descendible supporting pins passing through the mounting table, the device comprising: a disk substantially equal in size to the substrate, having insertion holes which allow the supporting pins to be inserted therethrough and being supportable by the carrier arm; and a sensor, which is provided on the disk, capable of detecting whether the supporting pin inserted through the insertion hole of this disk exists or not; and a controller for calculating by an operation, after receiving an output signal from the sensor, a position to which the carrier arm is to be moved in a vertical direction relatively to the disk from a detection position of a tip of the supporting pin, an amount of this movement exceeding at least a thickness of the carrier arm and for teaching this position to the carrier arm as the retreat permission position of the carrier arm.

According to the present invention, since the tip of the supporting pin is detected in the through hole by the sensor, it is possible to calculate by, for example, the operation or the like the position to which the carrier arm is to be moved relatively to the disk in the height direction from the detection position of the tip of the supporting pin, the amount of this movement exceeding at least the thickness of the carrier arm, and to automatically teach the retreat permission position of the carrier arm by using the calculated position as the retreat permission position of the carrier arm.

Further, when a disk having a through hole formed in a center portion thereof and a camera visually recognizing a known center target thereunder from the through hole is used as the aforesaid disk, the camera attached to the disk visually recognizes the known target thereunder from the through hole so that the fine adjustment of a forward movement position and a right-left position of the carrier arm can be made easily while looking at an image, thereby enabling accurate detection of a substrate delivery position.

DETAILED DESCRIPTION OF THE INVENTION

Hereinafter, an embodiment of this invention will be explained in detail based on the drawings. In this embodiment, a substrate carrier in a heat processing unit (hot plate unit) for heat-processing a semiconductor wafer as a substrate will be explained as an example.

Figure 4:
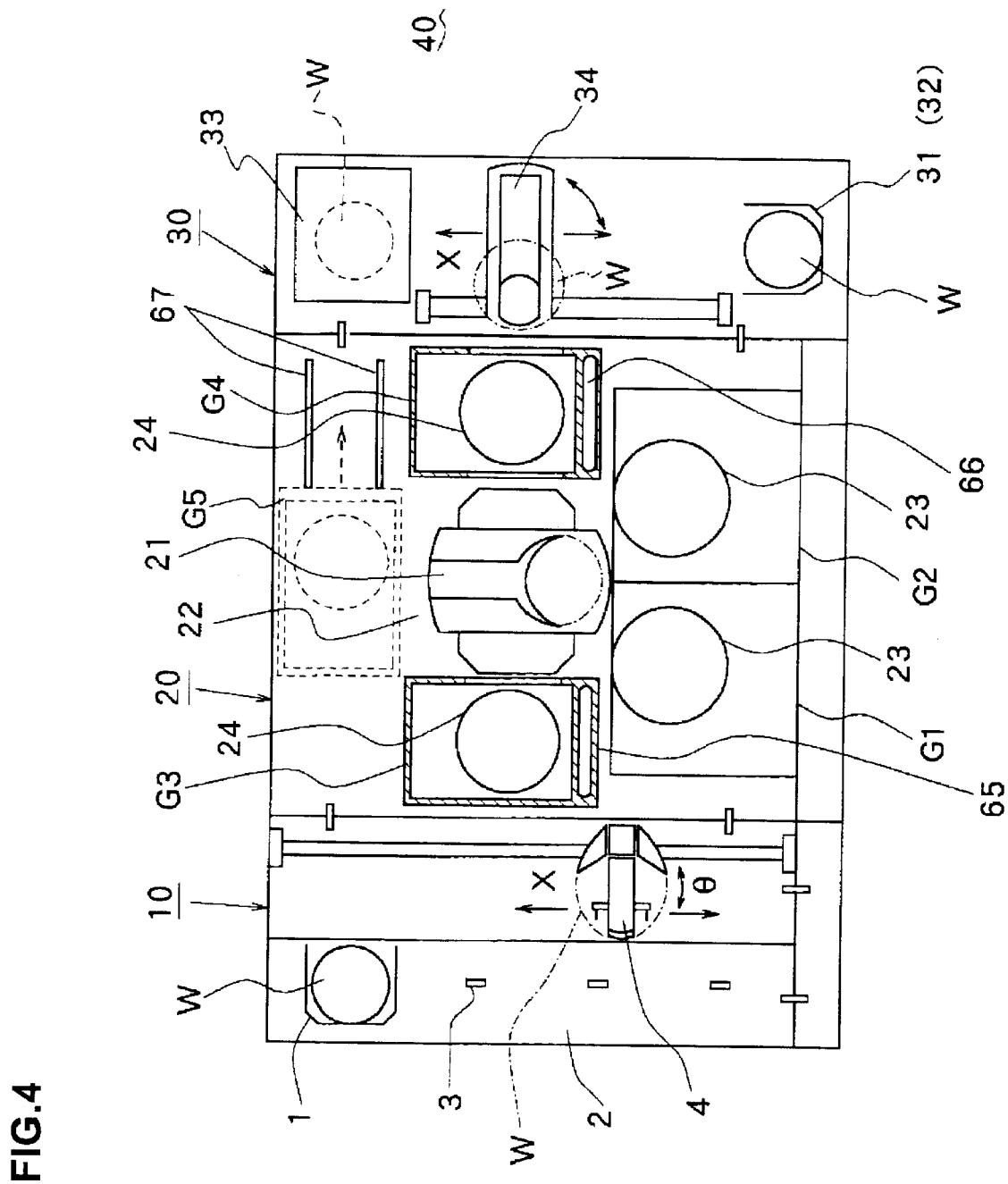
FIG. 4 is a schematic plan view of a resist solution coating and developing system to which the teaching device of this invention is applied.
Figure 5:
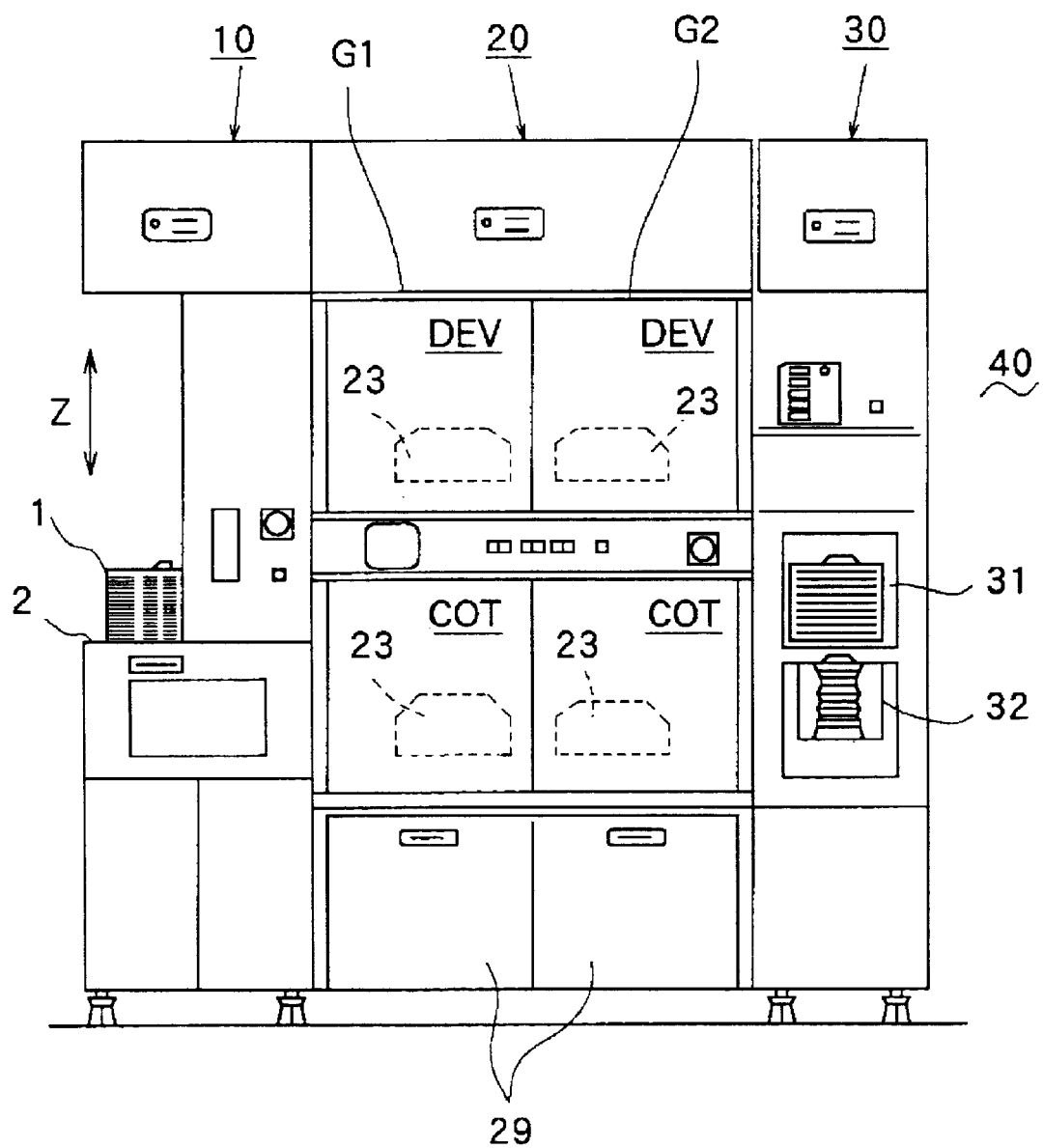
FIG. 5 is a schematic front view of the resist solution coating and developing system in FIG. 4.
Figure 6:
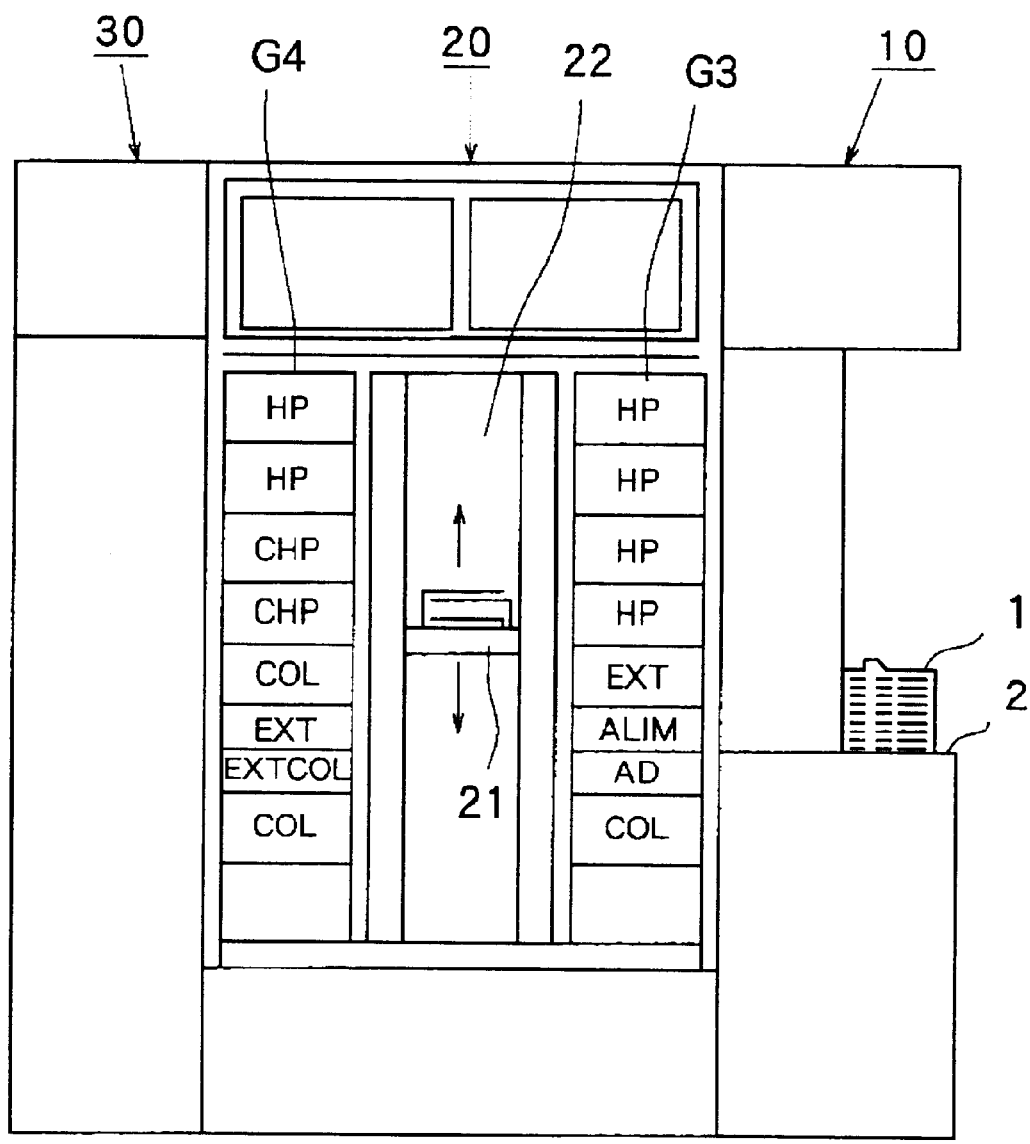
FIG. 6 is a schematic rear view of the resist solution coating and developing system in FIG. 4.

FIG. 4 is a schematic plan view of an embodiment of a resist solution coating and developing system, FIG. 5 is a front view of FIG. 4, and FIG. 6 is a rear view of FIG. 5.

An essential part of the resist solution coating and developing system is composed of: a cassette station 10 (transfer section) in which a wafer cassette 1 carries a plurality of semiconductor wafers W (hereinafter, referred to as wafers W) as objects (substrates) to be processed are carried, for example, in a unit of 25 wafers into/out of the system from/to an external part, and each of the wafers W is carried to/from the wafer cassette 1; a processing station 20 including processing units in which various kinds of wafer-by-wafer type processing units for applying predetermined processing to the wafer W one by one in a coating and developing step are arranged in multiple tiers at predetermined positions; and an interface section 30 for delivering the wafer W to/from an aligner (not shown) provided adjacent to this processing station 20.

As shown in FIG. 4, the cassette station 10 is so structured that the plural, for example, up to four, wafer cassettes 1 are placed at positions of protrusions 3 on a cassette mounting table 2 in a line along a horizontal X direction, each wafer inlet/outlet facing a processing station 20 side, and wafer carrying tweezers 4 movable in a cassette arrangement direction (X direction) and in a wafer arrangement direction (Z direction) of the wafers W, which are accommodated in the wafer cassette 1 along a vertical direction, carry the wafer W selectively to each of the wafer cassettes 1. The wafer carrying tweezers 4 are structured to be rotatable in a θ direction so that the wafer W can be carried also to an alignment unit (ALIM) and an extension unit (EXT), belonging to a multi-tier unit section in a third group G3, which will be described later, on the processing station 20 side.

As shown in FIG. 4, the processing station 20 has in a center part thereof a main wafer transfer mechanism (a substrate transfer mechanism, a substrate carrier) 21 of a vertical transfer type, and all the processing units are grouped into one set or a plurality of sets, being arranged in multi-tiers around a chamber 22 accommodating this main wafer transfer mechanism 21. In this example, five groups G1, G2, G3, G4, and G5 are disposed. Multi-tier units of the first group G1 and the second group G2 are arranged in parallel on a front side (front direction in FIG. 8) of the system, a multi-tier unit of the third group G3 is arranged adjacent to the cassette station 10, a multi-tier unit of the fourth group G4 is arranged adjacent to the interface section 30, and a multi-tier unit of the fifth group G5 is arranged on a rear side.

In this case, as shown in FIG. 5, in the first group G1, two spinner-type processing units, for example, a resist coating unit (COT) and a developing unit (DEV) for developing a resist pattern are two-tiered from the bottom in the vertical direction, the spinner-type processing units being designed for performing predetermined processing while the wafer W is placed on a spin chuck (not shown) in a cup 23. Similarly, in the second group G2, two spinner-type processing units, for example, a resist coating unit (COT) and a developing unit (DEV) are two-tiered from the bottom in the vertical direction. The resist coating units (COT) are thus arranged on a lower side because it is troublesome to drain a resist solution in light of mechanism and maintenance. However, the resist coating units (COT) may be arranged on an upper side when necessary.

As shown in FIG. 6, in the third group G3, oven-type processing units for performing predetermined processing while the wafer W is placed on a wafer mounting table 24, for example, a cooling unit (COL) for cooling the wafer W, an adhesion unit (AD) for performing hydrophobic treatment for the wafer, an alignment unit (ALIM) for aligning the wafer W, an extension unit (EXT) for carrying in/out the wafer W, four hot plate units (HP) for baking the wafer W are, for example, eight-tiered from the bottom in the vertical direction. Similarly, in the fourth group G4, oven-type processing units, for example, a cooling unit (COL), an extension and cooling unit (EXTCOL), an extension unit (EXT), a cooling unit (COL), two chilling hot plate units (CHP) having a quenching function, and two hot plate units (HP) are, for example, eight-tiered from the bottom in the vertical direction.

The cooling units (COL) and the extension and cooling unit (EXTCOL) whose processing temperature is low are arranged on a lower side and the hot plate units (HP), the chilling hot plate units (CHP), and the adhesion unit (AD) are arranged on an upper side as described above so that mutual thermal interference among the units can be reduced. Of course, random multi-tiered arrangement is also possible.

Incidentally, in the processing station 20, as shown in FIG. 4, inside side walls of the multi-tier units (oven-type processing units) of the third group G3 and the fourth group G4 adjacent to the multi-tier units (spinner-type processing units) of the first group G1 and the second group G2, ducts 65 and 66 are provided respectively to pass therethrough in the vertical direction. These ducts 65 and 66 are so structured that a clean air of a down flow or an air whose temperature has been specially adjusted is made to flow therethrough. This duct structure blocks heat generated in the oven-type processing units of the third group G3 and the fourth group G4, thereby preventing the transmission of the heat to the spinner-type processing units of the first group G1 and the second group G2.

This processing system is so structured that a multi-tier unit of the fifth group G5 can be also arranged on a rear side of the main wafer transfer mechanism 21 as shown by the dotted line in FIG. 4. This multi-tier unit of the fifth group G5 is movable along a guide rail 67 sideways when seen from the main wafer transfer mechanism 21. Therefore, even when the multi-tier unit of the fifth group G5 is provided, a space is secured by sliding the unit so that a maintenance work of the main wafer transfer mechanism 21 can be easily performed from the rear side.

The interface section 30 is equal in depth size to the processing station 20, but is smaller in a width size. This interface section 30 has a transferable pickup cassette 31 and a stationary buffer cassette 32 which are arranged in two tiers in a front part thereof, an edge exposure unit 33 disposed in a rear part thereof, and a wafer carrier arm 34 disposed in a center part thereof. This carrier arm 34 is structured to move in the X and Z directions to carry the wafer W to both of the cassettes 31 and 32 and the edge exposure unit 33. Further, the carrier arm 34 is structured to be movable in the θ direction so that it can carry the wafer W also to the extension unit (EXT) belonging to the multi-tier unit of the fourth group G4 on the processing station 20 side and a wafer delivery table (not shown) on an adjacent aligner side.

The processing system as structured above is installed in a clean room 40, and cleanliness of each of the sections is further enhanced inside the system by an efficient vertical laminar flow method.

Next the operation of the above-described processing system will be explained.

First, in the cassette station 10, the wafer carrying tweezers 4 access the cassette 1, which accommodates unprocessed wafers W, on the cassette mounting table 2 to take out one of the wafers W from this cassette 1. The wafer carrying tweezers 4, when taking out the wafer W from the cassette 1, move to the alignment unit (ALIM) disposed in the multi-tier unit of the third group G3 on the processing station 20 side to place the wafer W on the wafer mounting table 24 inside the unit (ALIM). The wafer W undergoes orientation flat alignment and centering on the wafer mounting table 24. Thereafter, the main wafer transfer mechanism 21 accesses the alignment unit (ALIM) from an opposite side to receive the wafer W from the wafer mounting table 24.

In the processing station 20, the main wafer transfer mechanism 21 first carries the wafer W to the adhesion unit (AD) belonging to the multi-tier unit of the third group G3. The wafer W undergoes hydrophobic treatment in this adhesion unit (AD). When the hydrophobic treatment is finished, the main wafer transfer mechanism 21 carries the wafer W out of the adhesion unit (AD) to subsequently carry it to the cooling unit (COL) belonging to the multi-tier unit of either the third group G3 or the fourth group G4. The wafer W is cooled to a temperature set as a temperature before resist coating treatment, for example, 23° C. in this cooling unit (COL). When the cooling processing is finished, the main wafer transfer mechanism 21 carries the wafer W out of the cooling unit (COL) to subsequently carry it to the resist coating unit (COT) belonging to the multi-tier unit of either the first group G1 or the second group G2. In this resist coating unit (COT), the wafer W is coated with a resist having a uniform thickness over a surface of the wafer W by a spin-coat method.

When the resist coating treatment is finished, the main wafer transfer mechanism 21 carries the wafer W out of the resist coating unit (COT), and subsequently carries it to the hot plate unit (HP). In the hot plate unit (HP), the wafer W is placed on a mounting table to undergo prebake processing at a predetermined temperature, for example, 100° C. for a predetermined time. Through this prebake processing, a residual solvent can be evaporated for removal from a coating film on the wafer W. After the prebake is finished, the main wafer transfer mechanism 21 carries the wafer W out of the hot plate unit (HP) to subsequently carry it to the extension and cooling unit (EXTCOL) belonging to the multi-tier unit of the fourth group G4.

In this cooling unit (COL), the wafer W is cooled to a temperature, for example, 24° C., appropriate for a subsequent step, namely, an edge exposure processing in the edge exposure unit 33. After this cooling, the main wafer transfer mechanism 21 carries the wafer W to the extension unit (EXT) immediately thereabove to place the wafer W on a mounting table (not shown) in this unit (EXT). When the wafer W is placed on the mounting table in this extension unit (EXT), the carrier arm 34 in the interface section 30 accesses from an opposite side to receive the wafer W. Then, the carrier arm 34 carries the wafer W to the edge exposure unit 33 in the interface section 30. Here, the wafer W undergoes exposure on an edge portion thereof.

When the edge exposure is finished, the carrier arm 34 carries the wafer W out of the edge exposure unit 33 to transfer it to a wafer receiving table (not shown) on the adjacent aligner side. In this case, the wafer W is sometimes accommodated temporarily in the buffer cassette 32 before being delivered to the aligner.

When the wafer W is returned to the wafer receiving table on the aligner side after the whole image exposure in the aligner is finished, the carrier arm 34 in the interface section 30 accesses this wafer receiving table to receive the wafer W, and carries the received wafer W to the extension unit (EXT) belonging to the multi-tier unit of the fourth group G4 on the processing station 20 side to place it on a wafer receiving table. In this case, too, the wafer W is sometimes accommodated temporarily in the buffer cassette 32 in the interface section 30 before being delivered to the processing station 20 side.

The main wafer transfer mechanism 21 carries the wafer W placed on the wafer receiving table to the chilling hot plate unit (CHP), where the wafer W undergoes post-exposure bake processing for preventing the occurrence of fringe or inducing an acid catalyst reaction in a chemically amplified resist (CAR).

Thereafter, the wafer W is carried to the developing unit (DEV) belonging to the multi-tier unit of either the first group G1 or the second group G2. In this developing unit (DEV), the wafer W is placed on a spin chuck, and a developing solution is supplied evenly all over the resist on-the surface of the wafer W by, for example, a spray method or a discharge method from nozzles. When the developing is finished, a rinse agent is supplied to the surface of the wafer W to wash away the developing solution.

When the developing step is finished, the main wafer transfer mechanism 21 carries the wafer W out of the developing unit (DEV) to subsequently carry it to the hot plate unit (HP) belonging to the multi-tier unit of either the third group G3 or the fourth group G4. In this unit (HP), the wafer W undergoes post-bake processing at a temperature of, for example, 100° C. for a predetermined time. This processing cures the resist swollen due to the developing to enhance chemical resistance.

When the post-bake is finished, the main wafer transfer mechanism 21 carries the wafer W out of the hot plate unit (HP) to subsequently carry it to any one of the cooling units (COL). Here, after the temperature of the wafer W returns to a room temperature, the main wafer transfer mechanism 21 next transfers the wafer W to the extension unit (EXT) belonging to the third group G3. When the wafer W is placed on a mounting table (not shown) in this extension unit (EXT), the wafer carrying tweezers 4 on the cassette station 10 side access from an opposite side to receive the wafer W. Then, the wafer carrying tweezers 4 put the received wafer W into a predetermined wafer accommodating groove of the cassette 1, which is intended for accommodating the processed wafers, on the cassette mounting table, thereby completing the processing.

Next, the hot plate unit (HP) will be explained with reference to a cross sectional view in FIG. 7.

The hot plate unit (HP) has a processing chamber 50 for heat-processing the wafer W carried thereto by the main wafer transfer mechanism 21, and this processing chamber 50 has a shutter 51 for blocking an outside air, a mounting table 25 for placing the wafer W thereon, and supporting pins 80 capable of hoisting/lowering the wafer W on the mounting table 25.

The shutter 51 is movable vertically by the operation of a hoisting/lowering cylinder 52, and is structured to come into contact with a stopper 55 hanging from a cover 54 having an exhaust port 53 in a center of an upper part thereof to maintain the inside of the processing chamber 50 airtight when the shutter 51 ascends. Further, an air supply port (not shown) is provided in the stopper 55 and an air flowing into the processing chamber 50 from this air supply port is exhausted from the aforesaid exhaust port 53. Note that the processing chamber 50 is so structured that the air flowing from the air supply port does not come into direct contact with the wafer W inside the processing chamber 50 so that the wafer W can be heat-processed at a predetermined processing temperature.

The mounting table 25 is formed in a disk shape larger than the wafer W, and a heat source, for example, a heater 26 for heating the wafer W is incorporated therein. Proximity pins 70 for supporting the wafer W with a spaced interval being kept from the mounting table 25 are attached on the mounting table 25 to prevent the adhesion of particles and so on onto the wafer W. A plurality of, for example, three here, supporting pin guiding through holes 27 for allowing the supporting pins 80 to move thereto/therefrom are arranged at equal intervals in and concentrically with the mounting table 25. The mounting table 25 thus structured is formed of a material superior in heat conductivity such as, for example, an aluminum alloy.

Figure 7:
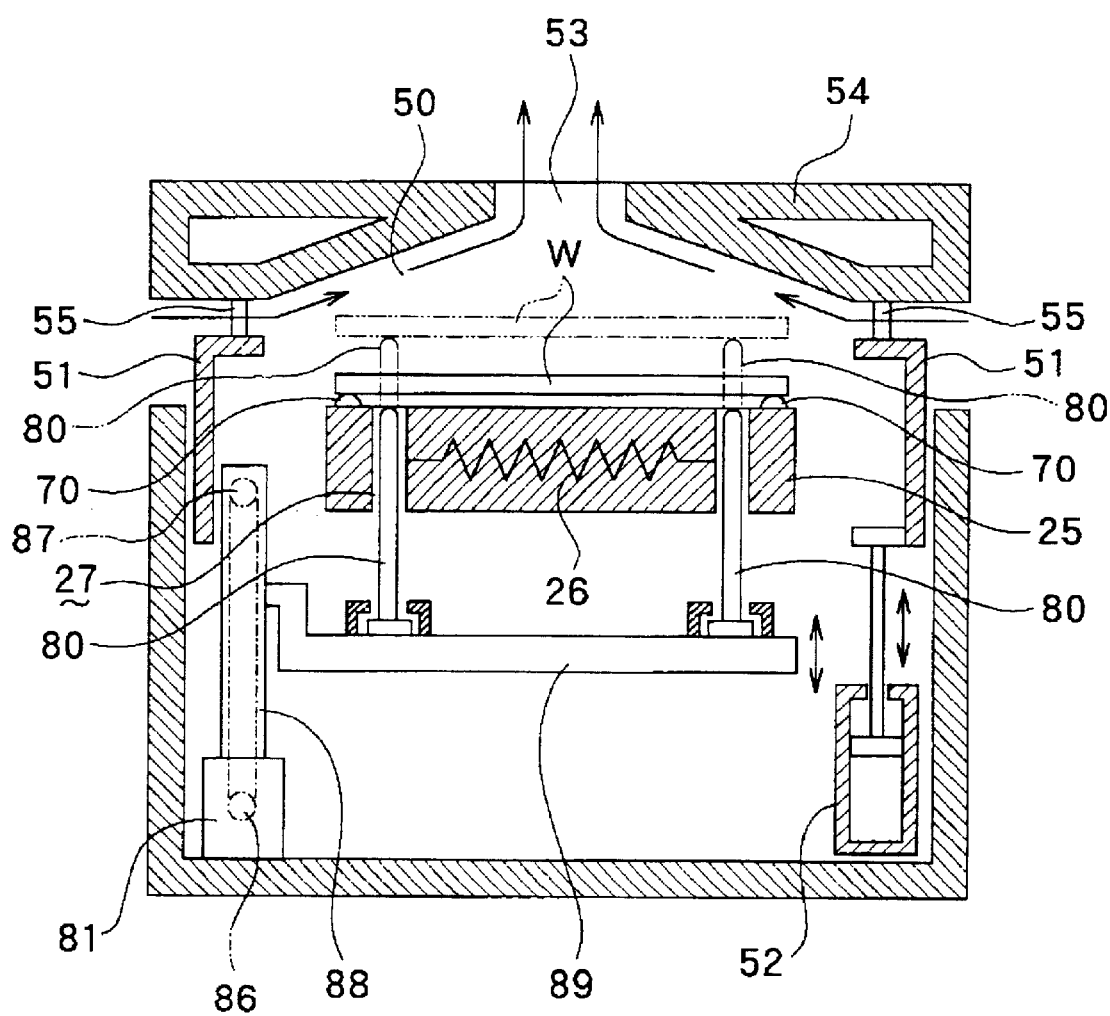
FIG. 7 is a schematic cross sectional view showing the structure of a heat processing unit to which the teaching device of this invention is applied.

As shown in FIG. 7, the supporting pins 80 are fixed to a coupling guide 89 at lower portions thereof and the coupling guide 89 is coupled to a timing belt 88. The timing belt 88 is hung around a drive pulley 86 driven by a stepping motor 81 and a driven pulley 87 disposed above this drive pulley 86, and clockwise and anticlockwise rotation of the stepping motor 81 allows the supporting pins 80 and the mounting table 25 to relatively move in the vertical direction. Therefore, the supporting pins 80 are capable of not only supporting the wafer W at a position shown by the two-dot chain line, but also placing the wafer W on the mounting table 25 as shown by the solid line when the supporting pins 80 are lowered from this state. Similarly to the above-mentioned proximity pins 70, these supporting pins 80 are also formed so as to minimize a difference between heat given to the wafer W from the supporting pins 80 and heat given from a surface of the mounting table 25.

Note that this invention is geared to a substrate carrier part for transferring the wafer W as a substrate between the supporting pins in each of the various processing units such as the aforesaid hot plate unit (HP) and the carrier arm 28 (FIG. 8) of the aforesaid wafer transfer mechanism 21.

Figure 8:
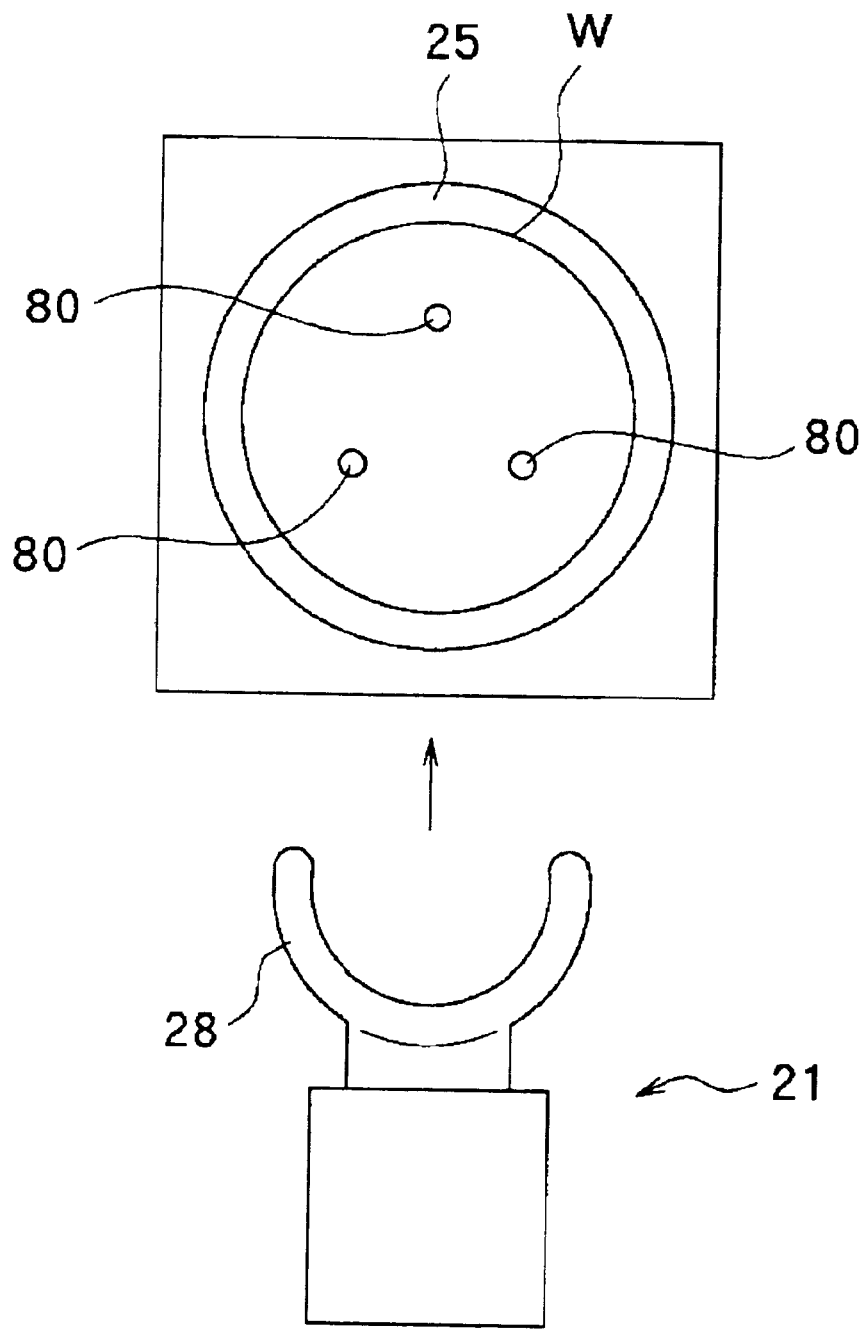
FIG. 8 is a schematic plan view showing the structure of a carrier of the heat processing unit in FIG. 7.
Figure 9:
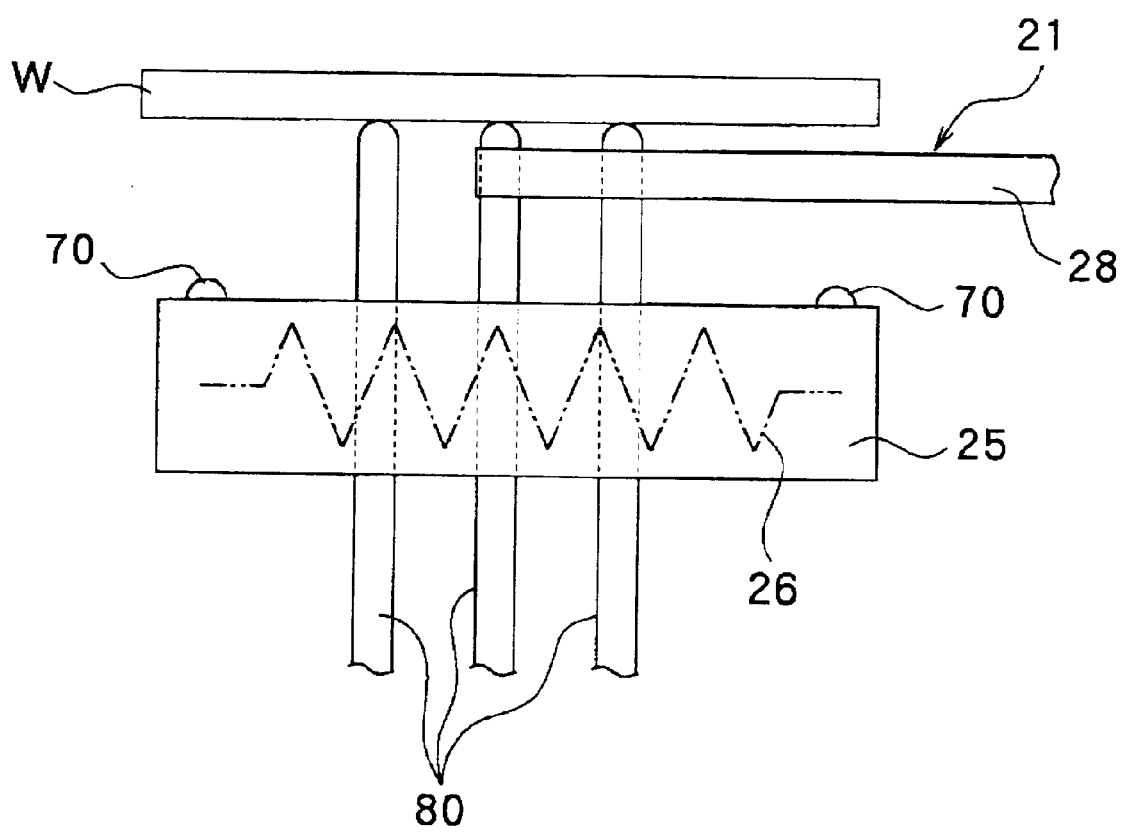
FIG. 9 is a schematic cross sectional view showing the structure of the carrier of the heat processing unit in FIG. 7.

As explained in FIG. 8, the aforesaid main wafer transfer mechanism 21 has the carrier arm 28, which carries the wafer W to a position above the mounting table 25 while holding a peripheral portion of the wafer W, to thereby deliver the wafer W to the plural, for example, three supporting pins 80 (FIG. 9). In such an operation, it is necessary for the carrier arm 28 to first send the wafer W to a proper position in a horizontal plane, and in order to achieve this, it is necessary to have the center of the wafer W coincide with a known target position.

It is also necessary to know a position, in terms of the vertical direction (height position), from which the carrier arm 28 can move back without interfering with other parts after the substrate is supported on the tips of the three supporting pins 80, namely, a retreat permission position (zero point) of the carrier arm after the wafer W is delivered. This is because, in order to avoid inconvenience of returning the carrier arm 28 while the wafer W is still left placed thereon, it is necessary to know a lower limit position to which the carrier arm 28 is to be descended or an upper limit position to which the supporting pins 80 are to be ascended and to find out and teach the carrier arm 28 side an appropriate timing for returning the carrier arm 28.

TEACHING JIG AND TEACHING DEVICE

Therefore, used in this embodiment are a teaching jig 5 for automatically detecting the height position of the tips of the aforesaid three supporting pins 80 and a teaching device for calculating the retreat permission position (zero point) of the carrier arm based on the detection position to teach the retreat permission position to the main wafer transfer mechanism 21.

Figure 1:
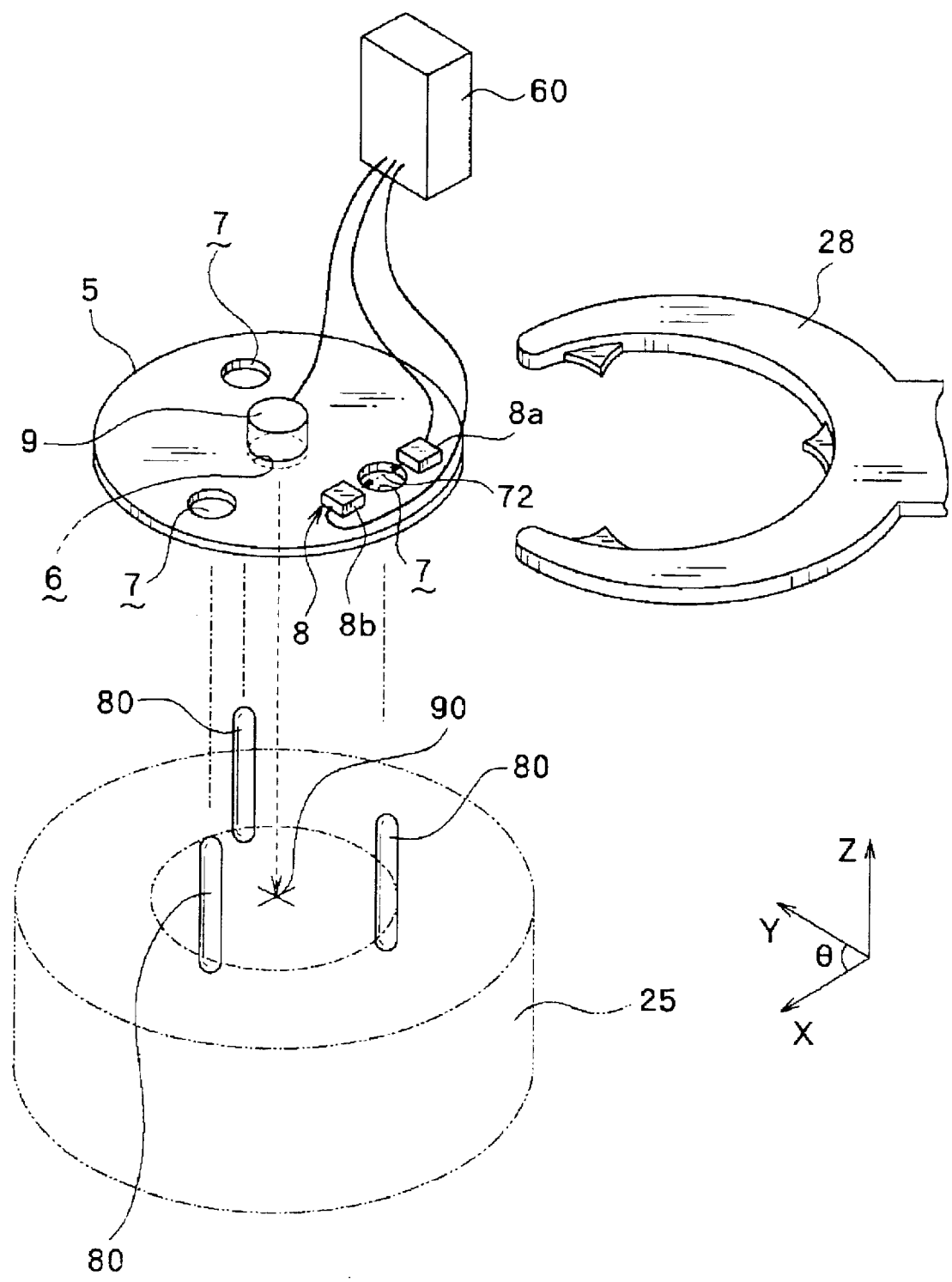
FIG. 1 is a schematic perspective view showing an example of a teaching device according to this invention.

As shown in FIG. 1, the teaching jig includes: a plurality of disks 5, which are disks substantially equal in size to the wafer W as a substrate, having a through hole 6 at a center part thereof and a plurality of (three in the drawing) insertion holes 7 for the supporting pins 80 on a plane surface in a periphery thereof; a camera 9, which is provided on the disks 5, for picking up an image of a known center target 90 (for example, a mark provided on the surface of the mounting table 25) thereunder from the through hole 6 at the center part of the disks 5; and a sensor, for example, a photosensor 8, which is provided on the disks 5, capable of detecting the existence or nonexistence of the supporting pin 80 inserted through at least one of the insertion holes 7 of the disks 5.

Here, the photosensor 8 capable of detecting the existence or nonexistence of the supporting pin 80 inserted through at least one of the insertion holes 7 is provided, but the photosensor 8 may of course be provided for each of the insertion holes 7. Thus providing the photosensors 8 for all the insertion holes 7 enables the detection of a difference in height size among the tips of the supporting pins 80 so that an inclination of a unit, for example, the hot plate unit (HP) can be confirmed. Accordingly, precision and reliability of the teaching jig can be enhanced.

The photosensor 8 has a light-emitting element 8*a* and a light-receiving element 8*b* arranged to face each other across the insertion hole 7 on one surface of the disks 5 so that an optical axis runs in a substantially perpendicular direction in the insertion hole 7 in the disks 5. The photosensor 8 constitutes a transmission-type photosensor in which the light-emitting element 8*a* emits a light 72 by electrical power and the existence or nonexistence of the supporting pin 80 between the light-emitting element 8*a* and the light-receiving element 8*b* is detected according to whether the light 72 is received by the light-receiving element 8*b* or not.

The reference numeral 60 in FIG. 1 denotes a controller mainly composed of a CPU, the controller receiving an image pickup signal of the aforesaid camera 9 to display an image of the known center target 90 on a not-shown monitor screen.

The controller 60 has a function of receiving an output signal of the aforesaid photosensor 8 to calculate by an operation a position to which the carrier arm 28 is to be moved in an upward direction or a downward direction relatively to the aforesaid disks from the detection position of the tip of the supporting pin 80, an amount of this movement exceeding at least a thickness of the carrier arm 28, and of teaching this position to the carrier arm 28 as the retreat permission position of the carrier arm.

DETECTION METHOD

Next, a method of detecting the height position (Z-axis position) of the carrier arm 28 from which the carrier arm 28 can be moved back after delivering the substrate (wafer W), namely, the retreat permission position (zero point position) of the carrier arm 28 will be explained with reference to FIG. 1, FIGS. 2(*a*) and 2(*b*), and FIGS. 3(*a*) and 3(*b*).

First, an operator's manual operation or an automatic operation of the main wafer transfer mechanism 21 causes the carrier arm 28 of the main wafer transfer mechanism 21 to hold the peripheral portion of the disks 5 as the aforesaid teaching jig. At this time, the disks 5 are held at a position allowing the supporting pins 80 to be inserted through the insertion holes 7 provided in the disks 5.

At this time, the following methods are possible as a method of moving the disks 5 to the position allowing the supporting pins 80 to be inserted through the insertion holes 7. Specifically, ① : to use an initial value in design values of the carrier arm 28 which is determined by the correlation among the arrangement of the supporting pins 80, the distance of the movement of the carrier arm 28 with the disks 5 being placed thereon, and a design allowance due to a diameter (dimension) of the insertion holes 7 of the disks 5, ② : when the movement based on the design value mentioned in the above ① is not easy, to find a reference point of a wafer carry-in port of a unit, for example, the hot plate unit (HP) with a rough adjustment sensor or the like to carry (move) the disks 5 to the position of the supporting pins 80 from the carry-in port reference point which has been determined by the design value, or ③ : to adjust a reference point manually in advance, and any one of these methods is applicable depending on the performance of the carrier arm 28. For example, when X>Y, X being an allowance degree of connection between the insertion holes 7 of the disks 5 and the supporting pins 80 and Y being arm precision before the teaching operation, the method of ①is adoptable, and when X<Y, the methods of ② and ③ are adoptable.

Figure 2A:
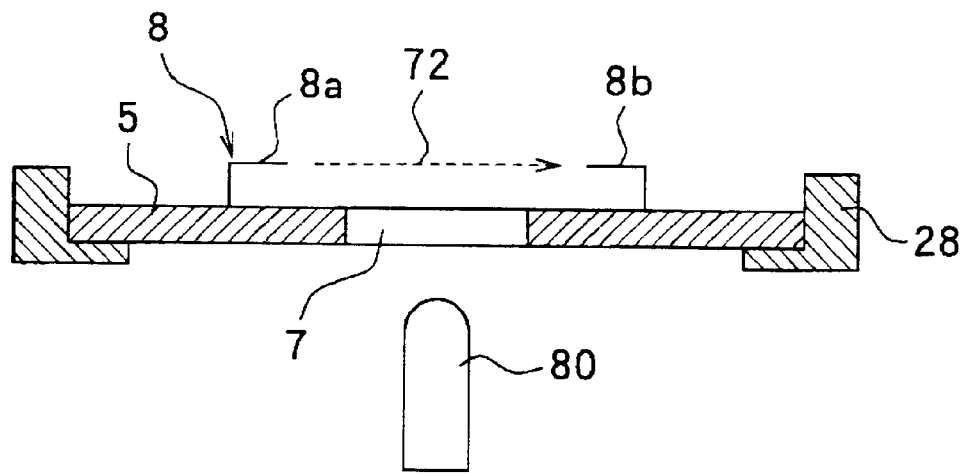
FIG. 2(a) and FIG. 2(b) are schematic cross sectional views of disks and a carrier arm used in this invention, FIG. 2(a) showing a state before supporting pins are inserted through insertion holes of the disks and FIG. 2(b) showing a state when the supporting pins are inserted through the insertion holes of the disks.
Figure 2B:
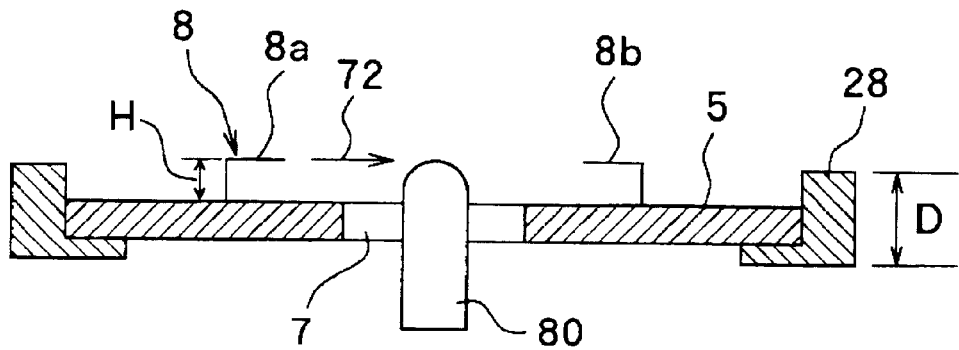

In this manner, the disks 5 held by the carrier arm 28 are carried to the position (the position of the wafer W shown by the two-dot chain line in FIG. 7) above the mounting table 25 (FIG. 2(*a*)). At this instant, the light 72 of the light-emitting element 8*a* is received by the light-receiving element 8*b* and the photosensor 8 is in an OFF state.

Then, the carrier arm 28 and the supporting pins 80 are first moved relatively in the horizontal plane, here, the carrier arm 28 is moved in the horizontal X-Y direction and rotated in the horizontal direction (θ direction), so that the center of the disks 5 is made to coincide with the known center target 90 while monitoring with the camera 9. The image of this center target 90 is displayed on the not-shown monitor screen for detection. Through this operation, the center position of the substrate (wafer W) is aligned.

Next, the carrier arm 28 and the supporting pins 80 are relatively moved in the vertical direction (Z direction). In this example, the carrier arm 28 is slowly moved downward to cause the supporting pins 80 to be inserted through the insertion holes 7 of the disks 5 as the teaching jig. In a short time, the light 72 of the light-emitting element 8*a* is blocked by the supporting pin 80, the tip of the supporting pin 80 is detected by the photosensor 8, and the photosensor 8 is turned on (FIG. 2(*b*)).

This operation clarifies a relative positional relation between the carrier arm 28 and the supporting pin 80. Specifically, when the tip of the supporting pin 80 reaches the position shown in FIG. 2(*b*), the wafer W should be on the tip of this supporting pin 80 in an actual substrate delivery operation not using the jig, which means that the wafer W has been raised from the surface of the disks 5 by an amount corresponding to the sum of a height H of the photosensor 8 and the thickness of the disks 5.

Figure 3A:
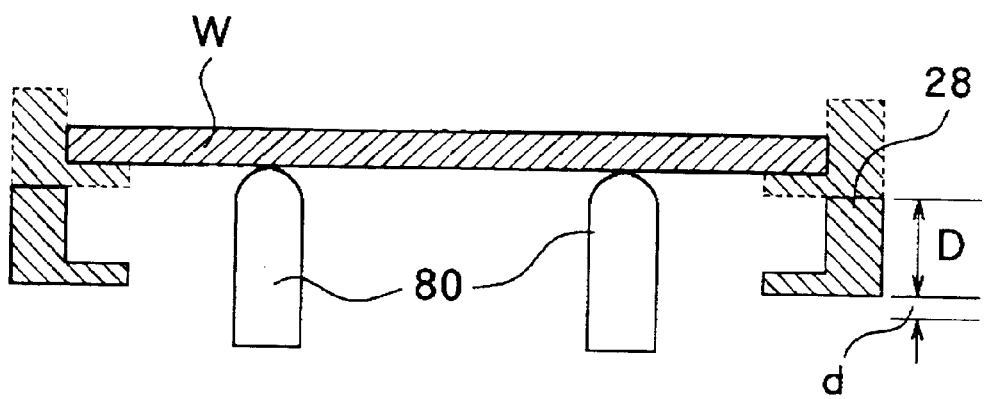
FIG. 3(a) and FIG. 3(b) are schematic cross sectional views of a wafer and the carrier arm in a method of this invention, FIG. 3(a) showing a state when the carrier arm descends relatively by a thickness amount of the carrier arm after the carrier arm has placed the wafer on the supporting pins, and FIG. 3(b) showing a state when the carrier arm descends relatively by an amount equal to the sum of the thickness of the carrier arm and a margin width after the carrier arm has placed the wafer on the supporting pins.
Figure 3B:
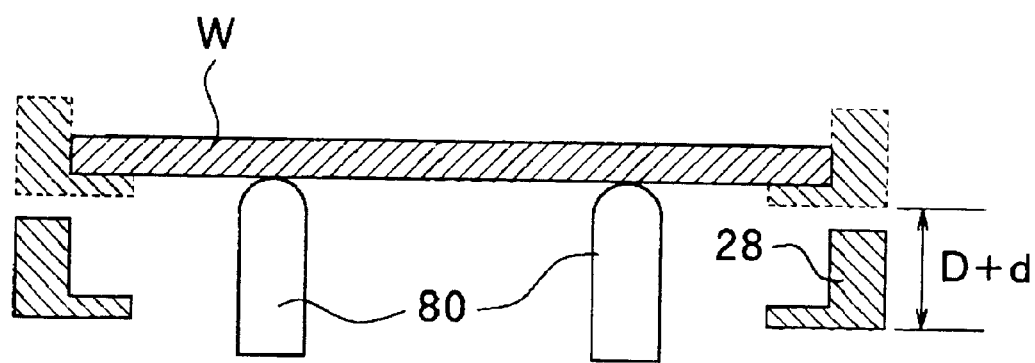

Therefore, as shown in FIG. 3(*a*), when the carrier arm 28 is lowered from the detection position of the tip of the supporting pin 80 relatively to the supporting pins 80 by a moving amount corresponding to at least a thickness D of the carrier arm 28, the carrier arm 28 can be moved back without giving any interference to the wafer W. In order to lower the carrier arm 28 relatively to the supporting pins 80, the supporting pins 80 may be raised or the carrier arm 28 may be lowered.

In light of keeping on the safe side in preventing the interference, in this embodiment, the position (zero point position) to which the carrier arm 28 is to be moved from the detection position of the tip of the supporting pin 80 relatively to the disks 5 by a moving amount in the height direction corresponding to the sum of the thickness D of the carrier arm 28 and a margin width d (for example, 1.5 mm) (D+d) is calculated by the controller 60 as the retreat permission position of the carrier arm 28 and this position is taught to an operation program of the carrier arm 28, namely, the main wafer transfer mechanism 21. After this automatic teaching operation is finished, the teaching jig 5 is removed from the carrier arm 28.

In this way, automatic teaching of the zero point of the carrier arm 28, in other words, the operation of determining the retreat permission position of the carrier arm 28 and the delivery position of the substrate (wafer W) (setting of the zero point) is performed automatically.

Incidentally, by an inverse operation based on the detection position of the tip of the supporting pin 80 at which the photosensor 8 is turned on, the position downward from the surface of the disks 5 by the distance corresponding to the height H of the photosensor 8 and the thickness of the disks 5 can be calculated as a supporting position of the supporting pins 80 for the wafer W (disks 5) so that the retreat permission position of the carrier arm 28 can be calculated based on this supporting position.

Incidentally, the above explanation is given on the case of detecting the height position of the supporting pin 80 (the retreat permission position of the carrier arm 28) after the center position of the disks 5 (wafer W) is detected, but the detection may be made through a reverse procedure. Specifically, the center position of the disks 5 (wafer W) may be detected after the height position of the supporting pin 80 (the retreat permission position of the carrier arm 28) is first detected.

Incidentally, in the above-described embodiment, the explanation is given on the case when the photosensor 8 is provided for one of the three insertion holes 7 provided in the disks 5, but the photosensor 8 may similarly be provided for each of the insertion holes 7. Since thus providing the photosensor 8 for each of the insertion holes 7 enables the detection of the height of all the supporting pins 80, higher precision detection is made possible to improve reliability of the device and to allow the detection of the inclination of the supporting pins 80.

Further, in the above-described embodiment, the explanation is given on the case of teaching the main wafer transfer mechanism 21 the position at which the carrier arm 28 thereof delivers the substrate to the supporting pins 80 in the hot plate unit (HP), but the present invention is of course applicable to a case of teaching the substrate delivery position between supporting pins in other processing units and other transfer mechanisms as long as the substrate delivery position between a carrier arm and supporting pins is taught. For example, the substrate delivery position between supporting pins in the extension unit (EXT) and the carrier arm 34 can be also taught.

As described hitherto, according to the method of detecting a substrate delivery position in a substrate carrier of this invention and the teaching device thereof, it is possible to automatically calculate a retreat permission position of a carrier arm by an operation based on a detection position of a tip of a supporting pin after receiving an output of a detecting means and to teach the carrier arm the substrate delivery position.

Further, a camera visually recognizes a known center target thereunder from a through hole at a center part of disks so that fine adjustment of a forward movement position and a right-left position of the carrier arm can be made easily while looking at an image. Accordingly, accurate detection of the substrate delivery position is made possible.

What is claimed is:

1. A method of determining a retreat permission position of a carrier arm when the carrier arm is moved back to retreat outside a mounting table after the carrier arm carries a substrate to a position above the mounting table while holding a peripheral portion of the substrate, to thereby place the substrate on a plurality of ascendable/descendible supporting pins passing through the mounting table, the method comprising the steps of:

preparing a disk substantially equal in size to said substrate;

providing said disk with a sensor to detect whether said supporting pin exists or not, for at least one insertion hole among a plurality of insertion holes formed to allow said plural supporting pins to be inserted therethrough;

carrying said disk to a position above said mounting table while said carrier arm holds the peripheral portion of said disk, and relatively moving said carrier arm and said supporting pins in a vertical direction to detect a tip of the supporting pin by said sensor;

calculating a position to which said carrier arm is to be moved in a height direction relatively to said disk from a detection position of said tip of said supporting pin, an amount of this movement exceeding at least a thickness of said carrier arm, thereby determining this position as the retreat permission position of the carrier arm.

2. A determining method according to claim 1, wherein a transmission-type photosensor in which an optical axis runs in a substantially perpendicular direction in the insertion hole of the disk is used as said sensor.

3. A determining method according to claim 1, wherein the retreat permission position of said carrier arm is defined as a position calculated from the detection position of said tip of said supporting pin by further adding in the height direction a margin width to the moving amount corresponding to the thickness of the carrier arm.

4. A determining method according to claim 1, wherein a disk provided with a camera to pick up an image of an area thereunder through a through hole formed in a center portion is used as said disk, and the method further comprising, prior to relatively moving said carrier arm and said supporting pins in the vertical direction, the step of:

relatively moving said carrier arm and said supporting pins in a horizontal plane to have a center of said disk coincide with a known center target while monitoring with said camera.

5. A device for teaching a retreat permission position of a carrier arm when the carrier arm is moved back to retreat outside a mounting table after the carrier arm carries a substrate to a position above the mounting table while holding a peripheral portion of the substrate, to thereby place the substrate on a plurality of ascendable/descendible supporting pins passing through the mounting table, the device comprising:

a disk substantially equal in size to said substrate, having insertion holes which allow said supporting pins to be inserted therethrough and being supportable by said carrier arm;

a sensor, which is provided on said disk, to detect whether the supporting pin inserted through the insertion hole of this disk exists or not; and a controller for calculating by an operation, after receiving an output signal from said sensor, a position to which the carrier arm is to be moved in a vertical direction relatively to said disk from a detection position of a tip of the supporting pin, an amount of this movement exceeding at least a thickness of said carrier arm and for teaching this position to said carrier arm as the retreat permission position of the carrier arm.

6. A device for teaching a retreat permission position according to claim 5, wherein said sensor is a photosensor in which an optical axis runs substantially in a perpendicular direction in the through hole of said disk.

7. A device for teaching a retreat permission position according to claim 5, wherein as the retreat permission position of said carrier arm, said controller teaches said carrier arm a position calculated from the detection position of said tip of said supporting pin by further adding a margin width in a height direction to the moving amount corresponding to the thickness of the carrier arm.

8. A device for teaching a retreat permission position according to claim 5, wherein said disk has a through hole formed in a center part thereof and a camera visually recognizing a known center target thereunder from this through hole.

* * * * *